United States Patent
Wickersham, Jr.

(10) Patent No.: US 6,848,608 B2
(45) Date of Patent: Feb. 1, 2005

(54) METHOD OF BONDING SPUTTERING TARGET MATERIALS

(75) Inventor: Charles E. Wickersham, Jr., Columbus, OH (US)

(73) Assignee: Cabot Corporation, Boston, MA (US)

( * ) Notice: Subject to any disclaimer, the term of this patent is extended or adjusted under 35 U.S.C. 154(b) by 0 days.

(21) Appl. No.: 10/674,281

(22) Filed: Sep. 29, 2003

(65) Prior Publication Data
US 2004/0129560 A1 Jul. 8, 2004

Related U.S. Application Data

(60) Provisional application No. 60/415,272, filed on Oct. 1, 2002, and provisional application No. 60/449,783, filed on Feb. 25, 2003.

(51) Int. Cl.[7] .......................... B21D 39/00; B23K 31/02; C23C 14/00
(52) U.S. Cl. ...................... 228/159; 228/107; 228/155; 228/160; 204/298.12; 204/298.13; 204/192.12
(58) Field of Search ................................. 228/107, 193, 228/155, 159, 160; 204/298.12, 298.13, 298.14, 298.09, 192.12

(56) References Cited

U.S. PATENT DOCUMENTS

| | | | | |
|---|---|---|---|---|
| 2,085,277 A | * | 6/1937 | Smith | 220/602 |
| 4,468,313 A | | 8/1984 | Okumura et al. | 204/298 |
| 4,887,761 A | | 12/1989 | Hardwick | 228/107 |
| 4,966,676 A | * | 10/1990 | Fukasawa et al. | 204/298.12 |
| 5,009,765 A | | 4/1991 | Qamar et al. | 204/298.12 |
| 5,025,974 A | | 6/1991 | Strickland | 228/107 |
| 5,050,789 A | | 9/1991 | Bement et al. | 228/107 |
| 5,067,649 A | | 11/1991 | Hardwick | 228/107 |
| 5,104,027 A | | 4/1992 | Persson | 228/107 |
| 5,143,590 A | | 9/1992 | Strothers et al. | 204/298.12 |
| 5,226,579 A | | 7/1993 | Bergmann et al. | 228/107 |

(List continued on next page.)

FOREIGN PATENT DOCUMENTS

JP   59-181623   10/1984

OTHER PUBLICATIONS

Article, "Fabrication of Bimetallic Ta–Cu Targets by Explosion Welding," by M. Turnňa et al., published in the Proceedings of the International Symposium on Intense Dynamic Loading and Its Effects, Jun. 3–7, 1986, Beijing, China (pp. 991–996).

Primary Examiner—L. Edmondson

(57) ABSTRACT

A method of forming a sputtering target is described that involves bonding a backing plate onto a casement having one or more recesses that contain target material to form a bonded target. During the bonding process, the bonded target is optionally vacuum sealed within the recess. The bonded target is then optionally annealed while under vacuum to form an annealed sputtering target. The sputtering target can then be retrieved by removing at least a portion of the casement from the sputtering target in one or several steps. Also described is a casement having one or more recesses containing bonded target material that is optionally vacuum sealed in the casement. The casement, as well as the backing plate that is optionally bonded onto the casement, are further described as well as other options and methods.

72 Claims, 1 Drawing Sheet

Explosion Bond Layout

U.S. PATENT DOCUMENTS

| Patent No. | | Date | Inventor | Class |
|---|---|---|---|---|
| 5,230,459 | A | 7/1993 | Mueller et al. | 228/164 |
| 5,242,098 | A | 9/1993 | Hardwick | 228/107 |
| 5,318,213 | A | 6/1994 | Strickland et al. | 228/107 |
| 5,323,955 | A | 6/1994 | Bergmann et al. | 228/262.7 |
| 5,342,496 | A | 8/1994 | Stellrecht | 204/298.12 |
| 5,400,945 | A | 3/1995 | Bergmann et al. | 228/107 |
| 5,487,822 | A | 1/1996 | Demaray et al. | 204/298.09 |
| 5,522,535 | A | 6/1996 | Ivanov et al. | 228/122.1 |
| 5,565,071 | A * | 10/1996 | Demaray et al. | 204/192.12 |
| 5,593,082 | A | 1/1997 | Ivanov et al. | 228/122.1 |
| 5,676,803 | A | 10/1997 | Demaray et al. | 204/192.12 |
| 5,827,414 | A | 10/1998 | Westwood | 204/298.12 |
| 5,922,176 | A | 7/1999 | Caskey | 204/192.12 |
| 5,961,027 | A | 10/1999 | Szecket | 228/107 |
| 6,033,483 | A | 3/2000 | Demaray et al. | 118/733 |
| 6,035,785 | A | 3/2000 | Sabathier et al. | 102/476 |
| 6,073,830 | A | 6/2000 | Hunt et al. | 228/203 |
| 6,164,519 | A | 12/2000 | Gilman et al. | 228/107 |
| 6,283,357 | B1 * | 9/2001 | Kulkarni et al. | 228/155 |
| 6,376,281 | B1 | 4/2002 | Kohler et al. | 438/118 |
| 6,599,405 | B2 * | 7/2003 | Hunt et al. | 204/298.12 |
| 2001/0046610 | A1 | 11/2001 | Barnes et al. | 428/670 |
| 2002/0011279 | A1 | 1/2002 | Kardokus et al. | 148/522 |
| 2002/0162741 | A1 | 11/2002 | Gogh | 204/298.12 |
| 2002/0185369 | A1 * | 12/2002 | Sawamura | 204/192.12 |
| 2003/0173064 | A1 * | 9/2003 | Ueki et al. | 165/104.21 |
| 2004/0035698 | A1 * | 2/2004 | Ivanov et al. | 204/298.12 |

* cited by examiner

US 6,848,608 B2

METHOD OF BONDING SPUTTERING TARGET MATERIALS

This application claims the benefit under 35 U.S.C. §119(e) of prior U.S. Provisional Patent Application No. 60/415,272 filed Oct. 1, 2002, and U.S. Provisional Patent Application No. 60/449,783 filed Feb. 25, 2003, which are incorporated in their entirety by reference herein.

BACKGROUND OF THE INVENTION

The present invention relates to sputtering targets and other metal articles. More particularly, the present invention relates to methods to bond various metals together to form bonded sputtering targets and other bonded metal articles.

There are numerous techniques used to bond two metals together, such as diffusion bonding, explosion bonding, and the like. Typically, these processes involve the bonding of one sputtering target or target blank onto a backing plate and this is done one target assembly at a time. Needless to say, the bonding of one backing plate onto a sputtering target one at a time can be quite time-consuming and costly and further can lead to inconsistent quality control.

Furthermore, bonded targets are often annealed for various reasons, such as to relieve the mechanical stress produced in the bonded materials during bonding, to recrystallize the microstructure of the materials, and generally to obtain the desired metallurgical properties for a sputter target assembly. Typically, annealing is performed under vacuum, in an inert atmosphere, or both, to prevent the introduction of impurities into the bonded materials (e.g., from oxidation) during the annealing process. Vacuum annealing is considerably resource-intensive.

Accordingly, methods to improve upon the bonding process in order to reduce the time and cost of producing bonded sputtering targets and other metal articles are desirable.

SUMMARY OF THE PRESENT INVENTION

A feature of the present invention is to provide an improved method of bonding backing plates to sputtering targets, or vice versa.

A further feature of the present invention is to provide a method to form multiple sputtering targets onto a backing plate.

A further feature of the present invention is to provide a method to form multiple sputtering targets and other metal articles with consistent physical properties and bonding strengths.

Another feature of the present invention is to provide a method of bonding a backing plate to a target in a casement such that the target is vacuum sealed in the casement during bonding.

Additional features and advantages of the present invention will be set forth in part in the description that follows, and in part will be apparent from the description, or may be learned by practice of the present invention. The objectives and other advantages of the present invention will be realized and attained by means of the elements and combinations particularly pointed out in the description and appended claims.

To achieve these and other advantages, and in accordance with the purposes of the present invention, as embodied and broadly described herein, the present invention relates to a method of forming a sputtering target or other metal articles comprising bonding a backing plate to a casement having recessed areas that contain target materials. The bonding of the backing plate onto the casement forms multiple bonded target materials. The method then involves removing at least a portion of the casement from the bonded target materials. The step can then include removing any remaining portion of the casement from the bonded target material.

The present invention also relates to a method of forming a sputtering target or other metal articles comprising disposing a target in a recess of a casement such that a bonding surface of the target is exposed and substantially parallel to a top surface of the casement. The method further includes bonding a backing plate to the bonding surface of the target and to at least a portion of the top surface of the casement to form a bonded target that is vacuum sealed within the recess. The method further includes annealing the vacuum sealed bonded target to form an annealed sputtering target. The method then involves retrieving the sputtering target by removing at least a portion of the casement from the sputtering target.

The bonding of the backing plate onto the casement containing the target material(s) can be done by any bonding technique and preferably explosion bonding or diffusion bonding. The bonding step preferably vacuum seals the bonded target material(s) within the recess(es) of the casement.

The present invention further relates to a casement having multiple recessed areas or recesses that contain target materials wherein the top or exposed bonding surface of the target materials are separated from the backing plate material by a controlled gap and the backing plate is substantially flush with the casement surface. The present invention further relates to a casement having recessed areas or recesses that contain multiple target materials, as described above, wherein a backing plate is bonded onto at least the top or exposed bonding surfaces of the target materials.

As an option, an interlayer can be placed between the backing plate and the surface of the casement prior to the bonding of the backing plate.

It is to be understood that both the foregoing general description and the following detailed description are exemplary and explanatory only and are intended to provide a further explanation of the present invention, as claimed.

The accompanying drawings, which are incorporated in and constitute a part of this application, illustrate some of the embodiments of the present invention and together with the description, serve to explain the principles of the present invention.

DETAILED DESCRIPTION OF THE PRESENT INVENTION

Figure 2:
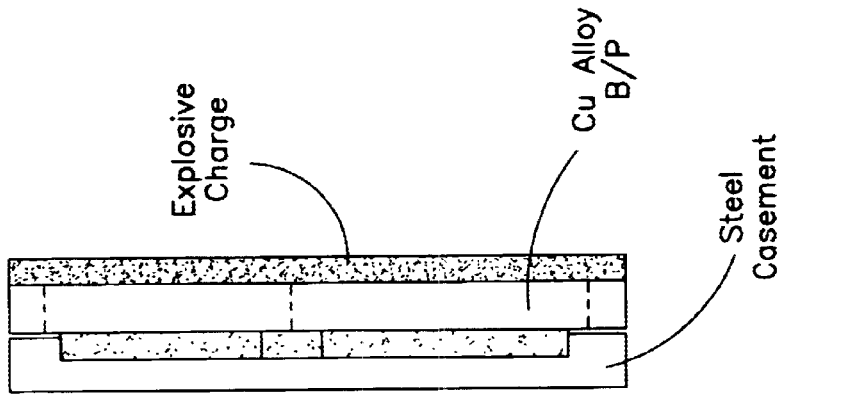
FIG. 2 is a side view of the casement containing multiple target materials in the recessed areas of the casement and further showing a backing plate facing the casement and target materials as well as an explosive charge behind the backing plate.

The present invention relates to sputtering targets and other metal articles. More particularly, the present invention provides a method of forming multiple sputtering targets at the same time during the bonding of the backing plate onto the plurality of sputter targets. This process can also be applied to other metal articles.

In the present invention, one or more sputtering targets are formed by bonding a backing plate onto a sputtering target(s) disposed or located in a recessed area(s) or recess (es) formed in the top surface of a casement. Located in the recess is target material or a target blank with the sputter surface of the target face down and its opposing bonding surface face up, with the bonding surface being substantially parallel to the top surface of the casement. Preferably, the exposed bonding surface or top of the target material (located in the recess) can be substantially flush or flush with the top surface of the casement, or above or below the top surface of the casement in order to form a gap between the backing plate and the top surface of the casement. When the backing plate is bonded onto the target material located in the recess of the casement, a bonded target material is formed wherein the backing plate is bonded onto the exposed upper or bonding surface of the target material located in the recess of the casement. Also, by this bonding technique, the exposed top surface of the casement may or may not be bonded to the backing plate. At least a portion of the exposed top surface of the casement is preferably bonded to the backing plate. Preferably, the bonding process creates a vacuum condition in the recess, and by bonding the backing plate to both the top surface of the casement and the target material, the bonded target formed is vacuum sealed within the recess of the casement.

Once the backing plate is bonded onto the target material and the exposed areas of the casement surface, at least a portion of the casement can be removed from the bonded target material. Generally, the portion removed at this point is the portion that is beyond the surface area of the backing plate that would serve as the flange of any backing plate. Then, any remaining portion of the casement still located on or around the bonded target material can then be removed to form the bonded target material.

If the backing plate is bonded onto the target material and not the exposed areas of the casement surface, then essentially the entire casement can be easily removed from the bonded target material. Both options will be explained in more detail below.

In more detail, for purposes of the present invention, the metal article is preferably a sputtering target but can be any shaped article wherein two pieces of metal, such as plates of metal, are bonded together. In the preferred embodiment, this generally involves a backing plate being bonded onto a target material. The backing plate can be any suitable metal material used as a backing plate in sputter applications or other applications. The target material can be any material capable of being sputtered. Examples of the backing plate include, but are not limited to, copper, or a copper alloy, tantalum, niobium, titanium, aluminum, and alloys thereof, such as TaW, NbW, TaZr, NbZr, TaNb, NbTa, TaTi, NbTi, TaMo, NbMo, and the like.

With respect to the target material to be bonded by the method of the present invention, examples include, but are not limited to, tantalum, niobium, cobalt, titanium, copper, aluminum, and alloys thereof, for instance, the alloys described above.

In the present invention, the target grade materials to be bonded with the backing plate member can be target grade material, for instance, as described in U.S. Pat. No. 6,348, 113 (Michaluk et al.), incorporated in its entirety by reference herein. This patent shows examples of plate that can be prepared from starting ingots, plates or billets. The purity, texture, and/or grain size and other properties, including size and the like are not critical to the present invention. The powder used to make the target grade plate as well as the target itself can have any purity with respect to the metal. For instance, the purity can be 99% or greater such as from about 99.5% or greater and more preferably 99.95% or greater and even more preferably 99.99% or greater, or 99.995% or greater or 99.999% or greater. The target can have any suitable grain size (e.g., average grain sizes of less than 300 microns, less than 100 microns, less than 50 microns, less than 20 microns) and/or texture. For instance, the texture can be random, a primary (111) texture, or a primary (100) texture that can be on the surface or throughout the entire thickness of the target. Preferably, the texture is uniform. Also, the target can have a mixed (111):(100) texture throughout the surface or throughout the entire thickness of the target. In addition, the target can be substantially void of textural banding, such as substantially void of (100) textural banding.

The thicknesses of the backing and the target material can be any suitable thickness used for forming sputtering targets. Alternatively, the backing plate and the target material or other metal plate to be bonded onto the backing plate can be any suitable thickness for the desired application. Examples of suitable thicknesses of the backing plate and of the target material include, but are not limited to, a backing plate with a thickness of from about 0.25 or less to about 2 inches or more in thickness and targets with a thickness ranging from about 0.060 inches to about 1 inch or greater. In the present invention, the target material to be bonded onto the backing plate can be conventional target grade material for instance as described in Michaluk et al. Once the shape of the target material is determined, a casement can be prepared which has one or more recessed areas or recesses so that the target material(s) fits within one or more of the recesses. Essentially, the casement can have one or more recesses cut or formed into the casement thereby forming recesses that match the shape of the target material with respect to diameter, width, length, and height. Generally, in one embodiment, the recess has the proper dimensions such that the target material is separated from the top surface of the casement by a gap of controlled dimension. This gap can be any distance, such as 0.25 inch or less or such as 1 or 2 inches or more. In other words, in one embodiment, the target's top or bonding surface is above the top surface of the casement. The target material can be even slightly below or slightly above the surface of the casement and there is no criticality with respect to being flush with the top surface of the casement.

With respect to the casement, the casement is preferably of a metal grade, such as steel or other similar materials. Steel is preferred due to its strength as well as availability and price. Essentially, a plate of metal, such as steel having a thickness greater than the height and diameter of the target materials can be used and through conventional cutting and machining techniques can have one or more recesses cut or formed into the casement. Examples of conventional cutting and machining techniques include, but are not limited to, boring, milling, grinding, electrode discharge machining or other suitable methods. The recess can have dimensions greater than the dimensions of the target material. For instance, the difference in target diameter or size and the diameter or size of the recess can be from about 1 mm to about 10 mm, and more preferably from about 1 mm to about 5 mm. In other words, the gap between the recess edge/side and the edge of the target is this size range. Or, the dimensions of the recessed area essentially mimic the dimensions of the target material in order to create a snug or tight fit in the recessed area when the target material is placed into the recessed area to securely fit the target within the recess. The casement should be of substantial thickness that even when recessed areas are formed, the casement is still strong enough, especially in the areas underneath the recessed areas, to withstand a bonding procedure, such as explosion bonding.

As to disposing one or more targets in recesses of a casement, the target is located or placed bonding side up and the opposing sputter side down into the corresponding recess of the casement. Notably, not every recess need contain a target. Also, more than one target blank or other metal layer can be disposed in the recess. Disposing can include force-fitting the target material into the recess so that the target is securely fit into the recess.

According to one embodiment of the present invention, the method further includes is disposing a liner or protective layer in at least one recess before the target is disposed in the same recess. The protective layer acts to prevent bonding of the sputtering side of the target to the bottom surface of the recess in the casement. The protective layer can cover all or any portion of the bottom surface of the recess. In addition, the protective layer can also cover all or any portion of the side surfaces of the recess. For example, the protective layer can be of any thickness and made from any suitable material. The protective layer is preferably made from paper, and more preferably is cardboard.

Prior to disposing or placing the target material(s) in the recessed area(s) of the casement, the casement can be polished and cleaned, and a glue polymer or other bonding material (e.g., protective material) can optionally be used to secure the target to the casement and either prevent or facilitate bonding between the target and the casement, should an explosion bonding mechanism be used. Preferably, this bonding material, if used, fills any existing gap between the casement and backing plate.

Figure 1:
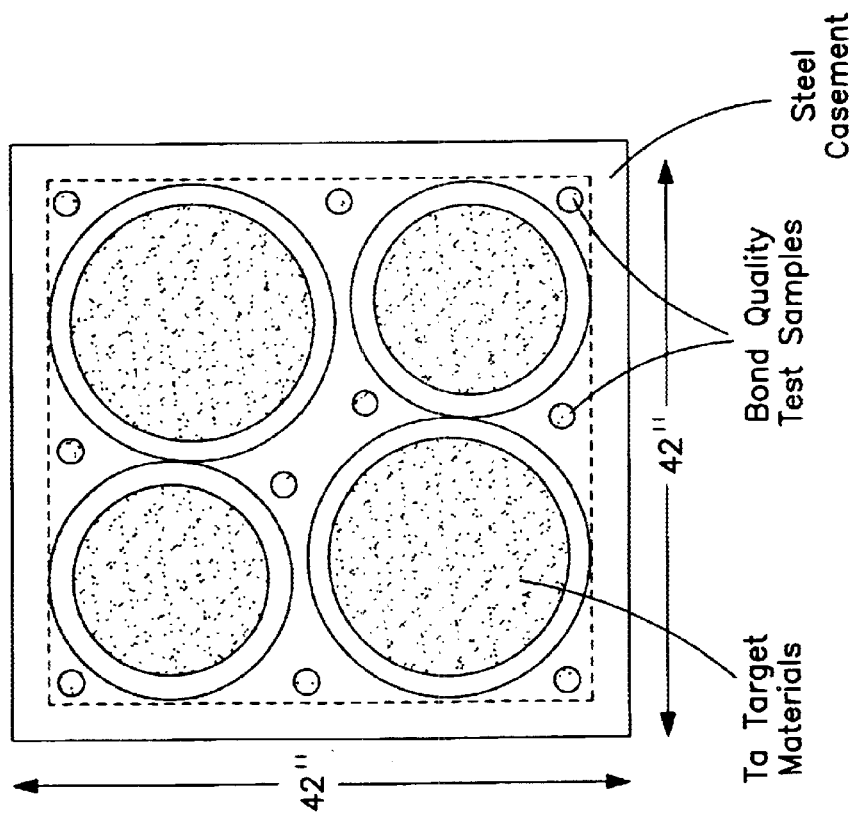
FIG. 1 is a top view of a casement containing multiple target materials in recessed areas.

With respect to the size of the casement or dimensions of the casement, any dimensions can be used as long as a metal casement or other suitable material can be formed or obtained. In one embodiment of the present invention, the casement has sufficient dimensions such that a sufficient number of recessed areas can be prepared based on the number and size of the target materials. In a preferred embodiment, the casement has dimensions from a length of from about 1 ft or less to about 5 ft or more and a width of from about 1 ft or less to about 5 ft or more. More preferably, the dimensions of the casement are about 42 inches by about 42 inches. The thickness or height of the casement is from about 1 inch or less to about 1 foot or more. Preferably, at least 2 recessed areas or recesses are present in the casement and at least 3, at least 4, at least 5, at least 6, at least 7, at least 8, at least 9, at least 10 or more recessed areas can exist which can be the same or different in dimensions in order to accommodate an equal number of target materials having dimensions that would fit into these recessed areas. As shown in FIG. 1, for instance, a casement can be prepared which essentially accommodates 4 target materials wherein 2 of the targets have the same dimensions and the other 2 targets have the same dimensions. Also, as an option, there can be smaller shaped recessed areas to receive bond quality test samples of target materials. These small recessed areas which can have dimensions of from about 1 inch or less by about 1 inch or less in diameter to about 6 inches or more by about 6 inches or more, are valuable in order to test the bonding quality and strength between the target materials and backing plate. These bond quality test sample recessed areas can be located throughout the casement as shown in FIG. 1. Also, as shown in FIG. 1, there can be dotted circular lines surrounding the target materials or on the backside of the backing plate. These dotted circular lines represent areas that would be cut to form the flange of the sputtering targets once bonding has occurred. These dotted circular lines or other similar markings can be located on the back of the casement such that after bonding, one can readily determine where the cutting of the casement should occur in order to retrieve the bonded sputter target material. These markings can be in the form of etched lines, painted markings, and the like. Alternatively, or in combination, the markings can be on the back surface of the backing plate to indicate the location of the flange portion.

Once the target material(s) is disposed or located in the recessed area(s) of the casement, the casement containing the target material(s) in the recessed area(s) can be mated with a backing plate such that the backing plate is adjacent to the top surface of the casement which has the exposed bonding surface of the target material(s) in the recessed area(s). The casement with the target material(s) and the backing plate which are face to face can then be clamped or locked into place using any conventional technology, such as clamps, bands of metal strips, vices, and other locking devices. Located behind the backing plate can be an explosive charge in order to achieve explosion bonding if this bonding technique is used. Generally, the amount of explosion charge is a charge sufficient to provide a bond between the target material and backing plate. The amount of explosion charge is preferably sufficient to also provide a bond between the backing plate and the exposed surface area of the casement. Generally, the amount of explosive charge for a 1 inch thick backing plate with a gap of about 0.25 inch ranges from about 0.018 pounds/sq inch for C10100 copper backing plate to about 0.024 pounds/sq inch for C18200 copper alloy backing plate using dynamite packed to a density of 1 g/cc. Other explosives such as Pentolite, TNT, Trimonite No. 1, C4, ammonium nitrate, or other suitable explosives may be used, but the explosive charge should be adjusted for the explosive energy. For additional information on the calculation of the explosive charge see the article by R. J. Carlson, V. D. Linse and R. H. Wittman, Materials Engineering 68, 70 (1968), incorporated in its entirety by reference herein.

As indicated above, a gap can exist between the backing plate and casement by the target bonding surface being higher or lower than the top surface of the casement. If explosion bonding is used, preferably this gap is filled so as to be at least level with the target bonding surface and preferably is filled above the height of the target bonding surface.

When explosion bonding is used, it is preferred to have a gap existing between the backing plate and the sputtering target prior to the explosion occurring. If the explosion bonding occurs without a gap, the bond may not adequately form or may not form at all. Accordingly, with this option, in one embodiment, a gap can exist between the backing plate and the target bonding surface and preferably no gap exists between the casement surface and the backing plate. A preferential location of the gap can be accomplished by creating a sufficient depth in the recessed area to have the sputtering target bonding surface below the top surface of the casement such that the backing plate contacts the casement without contacting the sputtering target. Also, the gap can be created by having the bonding surface of the target materials essentially flush with the surface of the casement. Then, with the application of the bonding or protective material around the exposed surface area of the casement and/or the reciprocal surface of the backing plate, the backing plate will bond onto the target bonding surface but not onto any casement surface since the bonding material is not on the surface of any target. Thus, any manner in which to create a gap between the backing plate and target but not a gap between the backing plate and casement can be used and the above methods are simply examples of how to achieve this preferential gap.

Preferably, the bonded preform has a sputter target having metallurgical properties that are similar to the target grade plate. For example, explosively bonding a target grade plate having an average grain size of less than about 100 microns and a texture substantially void of (100) textural bands according to the present invention preferably forms a bonded preform having a sputter target having an average grain size of less than about 100 microns and a texture substantially void of (100) textural bands. In addition, as a result of the explosive bonding, the bonded preform preferably has a backing plate that is harder than the backing plate member prior to be bonded, as measured quantitatively, for example, in Rockwell B scale. For instance, the hardness is increased by 5% or more, such as 10% or more, and 30%–60% or more. In one specific example, a backing plate, like C46400 went from a Rockwell B scale hardness of 63 before explosion bonding to a bulk hardness of 85 and an interface hardness of 100 after bonding.

The bond preform preferably has a bond interface between the target and the backing plate member, the bond interface having superior strength. For example, the bond strength can be from 10,000 p.s.i. to about 75,000 p.s.i. or higher, which is approximately twice the typical bond strength achieved by, for example, diffusion bonding. Other ranges include from about 25,000 p.s.i. to about 55,000 p.s.i., and from about 40,000 p.s.i. to about 56,000 p.s.i., and the like. This bond strength is preferably uniform through the bonded surface. As stated above, increased bond strength is particularly important as the diameter of the sputter target increases. Additionally, the bond interface formed by the present invention preferably includes no interdiffusion of the target grade plate and the backing plate member. Thus, the sputter target and the backing plate member can be more easily separated for recycling after use, for example, by reducing the amount of the reclaimed metal of either being contaminated with the other.

In lieu of explosion bonding, diffusion bonding techniques can be used wherein the backing plate is diffusion bonded onto the casement containing the target material using conventional diffusion techniques, such as hot isostatic pressing and the like. In the case of diffusion bonding, the areas in flush contact to the backing plate will be bonded and the areas with gaps or bonding barriers may remain unbonded. In the case of diffusion bonding, the casement is designed so that the target blank and the backing plate are in close contact. Similarly, the casement and backing plate can be in close contact or alternatively, be separated by a gap or bonding barrier to facilitate easy separation of the casement from the backing plate materials. Thus, with diffusion bonding, the preferred strategy with respect to the preferential location of the gap is the opposite when compared to the preferential location of the gap in explosion bonding. Put another way, the gap preferentially exists between the casement surface and the backing plate while the top or bonding surface of the target is in contact with the backing plate. This can be accomplished using similar techniques as described above, for instance, designing the recessed areas such that the top or bonding surface of the target is above the surface of the casement. Again, any mechanism to achieve this preferential gap location can be used.

After the backing plate is bonded onto the top surface of the target materials and exposed top surfaces of the casement, the desired dimensions of the backing plate can be cut away from the casement as described earlier. When the bonded target material/backing plate is cut away from the casement, there would generally be still a portion of the casement bonded onto the area of the backing plate that would serve as any possible flange of the target. At this point, this portion of the casement remaining and bonded onto the flange location of the target can then be machined away using any conventional machining techniques in order remove any remaining portions of the casement and to thereby obtain a target material with a backing plate bonded thereto. At this point, any conventional processing of the target can be done, such as polishing and the like.

According to one embodiment of the present invention, bonding the backing plate to the bonding surface of the target to form a bonded target, while at the same time bonding the backing plate to the exposed surface of the casement, also vacuum seals the bonded target within the recess of the casement. For example, during explosion bonding, a vacuum is drawn in the unoccupied space of the recess. Put another way, the explosion and the accelerating of the casement and backing plate forces air out between the casement and backing plate and seals the targets between the casement and backing plate. As a result of the backing plate being dually bonded, i.e., to the surface of the casement and to the bonding surface of the target material, the vacuum condition that is created within the recess during the explosion is maintained after bonding.

After the backing plate is bonded onto the bonding surface of the target material and exposed top surfaces of the casement to form a bonded target that is vacuum sealed within the recess, the method according to the present invention preferably involves annealing the bonded target/casement/backing plate to form an annealed target. The bonding methods described above can produce mechanical stress in the backing plate during bonding. The stress in the bonding plate can be reduced or eliminated by annealing the bonded target. Preferably, the bonded target is annealed under a vacuum to, among other things, prevent oxidation of the target materials. However, because bonding according to the method of the present invention creates a vacuum sealed bonded target within the recess, the bonded target can be annealed in an air furnace, since no air will reach the target. This permits a very simple and very economical annealing. Annealing can be at any temperature, and is preferably at a temperature of less than about 800° C. For instance, annealing can be at a temperature of from about 200 to about 800° C., and preferably from about 300 to about 500° C., and more preferably at a temperature below about 450° C. Preferably, the bonded target is annealed at a sufficient temperature and for a sufficient time to reduce or eliminate the stress in the backing plate, annealing times can be from about 1 minute to about 4 hours or more, and are preferably from about 1 hour to about 2.5 hours.

According to one embodiment of the present invention, the method can include optionally partitioning one or more of the bonded targets from the other bonded targets before the step of annealing. Preferably, the partitioned bonded targets are partitioned such that the bonded targets remain vacuum sealed in the recesses. The partitioned bonded target can then be individually annealed. Partitioning can include any suitable method of separating the bonded target from the other bonded targets in the casement. For example, partitioning can be by machining, waterjet cutting, punch pressing, plasma cutting, flame cutting, milling, grinding, sawing, laser cutting, boring, electrode discharge machining, or any combination thereof.

As to retrieving the sputtering target by removing at least a portion of the casement from the sputtering target, the desired dimensions of the backing plate can be cut away from the casement as described earlier to expose the sputter surface of the sputtering target. When the annealed bonded target material/backing plate is cut away from the casement, there would generally be still a portion of the casement bonded onto the area of the backing plate that would serve as any possible flange of the sputtering target. At this point, this portion of the casement remaining and bonded onto the flange location of the target can then be machined away using any conventional machining techniques in order remove any remaining portions of the casement and to thereby obtain a target material with a backing plate bonded thereto. At this point, any conventional processing of the target can be done, such as polishing and the like.

An embodiment of the present invention permits the multiple bonding of targets onto a backing plate in one bonding process and thus achieves a greater output of target materials bonded onto backing plates and further achieves a consistent bonding of the multiple targets. In addition, the small recesses that hold, as an option, bond quality test materials which can scattered throughout the casement are excellent tools for ensuring consistent bonding throughout the dimensions of the casement.

As indicated above, if no bonding of the casement and backing plate occur, then essentially the casement can be removed in one step and the casement will be intact and therefore can be reused.

As an option, an interlayer or protective layer can be located on top of the casement once the target materials are placed in the recessed areas of the casement. The interlayer or protective layer would be bonded onto the target materials and backing plate. This interlayer or protective layer can be any conventional interlayer material, such as, but not limited to, for the case of tantalum bonding to copper alloy backing plates, interlayer such as niobium, zirconium, titanium, or vanadium are materials that can enhance the bond quality. The technical paper by Öberg et al., Metallurgical Transactions A, 16, 841 (1985), incorporated in its entirety by reference herein, provides a description of the thermodynamic principles for choosing the appropriate bonding interlayer. Then, as described above, the interlayer can be machined away in the flange areas of the target material or can be left on the flange areas of the target material depending upon the design of the target material.

As another option, an interlayer or protective layer can first be placed on the casement and then the target materials inserted into the recessed areas such that the interlayer or protective layer is pressed into the recessed areas and the target material located above the interlayer or protective layer. By doing this option, during bonding, the backing plate can be bonded onto the target materials and onto the interlayer or protective layer. If the protective layer is of a substantial thickness and durability, the backing plate bonds onto this protective layer but not the casement. By doing this option, the integrity of the casement can be maintained such that the casement does not need to be destroyed in order to retrieve the bonded target material. Instead, the protective layer would be only sacrificed in order to cut away the desired target materials and flange diameters.

As another alternative, the interlayer or protective layer can have a template design such that the interlayer/protective layer essentially is shaped such that the surfaces of the protective layer only go over the non-recessed top areas of the casement. By doing this, the same goal is achieved whereby the bonding occurs on the protective layer and the target materials but not the casement.

As another option, the diameter of the target can be larger than the desired finished diameter. By doing this, this ensures that the bonding between the backing plate and the target surface is of high quality and by having an oversized target, the outer boundaries of the bonded target can be cut away. In other words, the excess target can be removed by machining or other means to leave a target having the desired dimensions and ensuring that the bond for the finished target of high quality. The amount of over sizing of the target can be any desired amount, such as 5%, 10% of the finished desired diameter to 25% or more.

As indicated above, a protective material can be placed on the top surface of the casement but not on the top surface of the targets located in the recessed areas of the casement during the bonding step. This protective material preferably prevents the bonding of the backing plate onto the top surface of the casement but permits the bonding of the backing plate onto the top surface of the targets. One example of such a protective material is a polymer such as a polymer glue, metal, and the like. Another example can be a ceramic material such as, alumina or silica glass.

With respect to explosion bonding, it is preferred to have a gap between the backing plate and the bonding surface of the target material to be bonded onto the backing plate. This permits the backing plate upon using explosion bonding to reach its most optimal velocity prior to impact onto the top or bonding surface of the target. On the other hand, by placing the top surface of the casement at a less than optimal distance achieves a less than optimal bonding velocity. Put another way, if the top surface of the casement is in close proximity or in contact with the backing plate during explosion bonding, the backing plate will not have an opportunity to reach optimal velocity prior to impact on the top surface of the casement and therefore will prevent bonding or significantly prevent substantial bonding onto the top surface of the casement. In the alternative, if the casement is further away from the most optimal gap for reaching maximum velocity, then the backing plate will contact the top or bonding surface of the target material at maximum velocity but by the time it reaches the top surface of the casement, maximum velocity will not exist and therefore the bonding onto the casement will be prevented or substantially minimized.

The above-described embodiments of the present invention have many advantages, including eliminating the need to anneal the bonded target under a vacuum which is very resource intensive.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. A method of forming sputtering targets, comprising:
   bonding a backing plate to a plurality of targets located in recesses in a top surface of a casement, wherein an exposed surface of said targets is bonded to said backing plate to form bonded targets; and
   removing said casement from said bonded targets to retrieve said sputtering targets.

2. The method of claim 1, wherein said bonding is explosive bonding.

3. The method of claim 1, wherein said bonding is diffusion bonding.

4. The method of claim 1, wherein said targets comprise tantalum or an alloy thereof.

5. The method of claim 1, wherein said targets comprise niobium or an alloy thereof.

6. The method of claim 1, wherein said targets comprise cobalt, titanium, copper, aluminum, tantalum, niobium, or alloys thereof.

7. The method of claim 1, wherein said backing plate comprises copper or an alloy thereof.

8. The method of claim 1, wherein said backing plate comprises cobalt, titanium, copper, aluminum, niobium, tantalum, or alloys thereof.

9. The method of claim 1, wherein said recesses comprise at least 2 recesses.

10. The method of claim 1, wherein said recesses comprise at least 4 recesses.

11. The method of claim 1, wherein said recesses comprise at least 2 recesses having the same or different dimensions to receive said targets, and further comprising at least one smaller recess to receive at least one bond quality test sample.

12. The method of claim 1, wherein said casement is a steel casement.

13. The method of claim 1, wherein said exposed surface of at least one of said targets is substantially flush with said top surface of said casement prior to said bonding.

14. The method of claim 1, wherein said exposed surface of at least one of said targets is not substantially flush with said top surface of said casement prior to said bonding.

15. The method of claim 1, wherein at least one of said targets is not attached to said casement in said recess.

16. The method of claim 1, wherein at least one of said targets is tightly fitted into said recess.

17. The method of claim 1, wherein at least one of said targets is fitted into said recess such that a gap exists between said target and said recess.

18. The method of claim 17, wherein said gap is from about 1 to about 10 mm.

19. The method of claim 1, wherein prior to said bonding, a gap exists between said backing plate and said exposed surface of said targets.

20. The method of claim 1, wherein prior to said bonding, said backing plate is substantially flush with said top surface of said casement, and wherein a gap exists between said backing plate and said exposed surface of said targets.

21. The method of claim 1, wherein prior to said bonding, a protective layer is disposed on said top surface of said casement to prevent bonding of said casement to said backing plate.

22. The method of claim 21, wherein said protective layer is a cardboard layer.

23. The method of claim 1, wherein prior to said bonding, a protective layer is disposed in at least one of said recesses to prevent bonding of said casement to at least one of said targets in said at least one recess.

24. The method of claim 1, wherein prior to said bonding, an interlayer is disposed on said top surface of said casement and said exposed surface of at least one of said targets to facilitate said bonding.

25. The method of claim 1, wherein said removing said casement from said bonded targets comprises cutting away at least a portion of said casement surrounding said bonded targets.

26. The method of claim 25, wherein said removing further comprises machining away any remaining portion of the casement from said bonded targets.

27. The method of claim 1, wherein said removing of said casement comprises cutting away portions of said casement surrounding said bonded targets and providing a sufficient dimension around each bonded target to form a flange from said backing plate around said sputtering targets.

28. The method of claim 1, wherein said removing of said casement from said bonded targets involves removing portions of said casement in one or several steps.

29. The method of claim 1, wherein a bond strength between at least one of said targets and said backing plate is from about 10,000 to about 75,000 p.s.i.

30. The method of claim 1, wherein a bond strength between at least one of said targets and said backing plate is from about 29,000 to about 55,000 p.s.i.

31. The method of claim 1, wherein at least one of said targets has an average grain size of less than about 100 microns.

32. The method of claim 1, wherein said backing plate has a hardness that is at least 10% greater in said backing plate after bonding compared to said backing plate prior to bonding to said target.

33. The method of claim 1, wherein said bonded targets are vacuum sealed within said recess.

34. The method of claim 33, further comprising annealing said bonded targets prior to said removing of said casement from said bonded targets.

35. The method of claim 34, wherein said annealing is in an air furnace.

36. The method of claim 34, wherein said annealing occurs at a temperature of less than about 800° C.

37. A method of forming a sputtering target, comprising:
   bonding a backing plate to a target located in a recess in a top surface of a casement, wherein an exposed surface of said target is bonded to said backing plate to form a bonded target that is vacuum sealed within said recess;
   annealing said bonded target to form an annealed bonded target; and
   removing at least a portion of said casement from said annealed bonded target to retrieve said sputtering target.

38. The method of claim 37, wherein said bonding is explosive bonding.

39. The method of claim 37, wherein said bonding is diffusion bonding.

40. The method of claim 37, wherein said target comprises tantalum or an alloy thereof.

41. The method of claim 37, wherein said target comprises niobium or an alloy thereof.

42. The method of claim 37, wherein said target comprises cobalt, titanium, copper, aluminum, tantalum, niobium, or alloys thereof.

43. The method of claim 37, wherein said backing plate comprises copper or an alloy thereof.

44. The method of claim 37, wherein said backing plate comprises cobalt, titanium, copper, aluminum, niobium, tantalum, or alloys thereof.

45. The method of claim 37, wherein said casement is a steel casement.

46. The method of claim 37, wherein said exposed surface of said target is substantially flush with said top surface of said casement prior to said bonding.

47. The method of claim 37, wherein said exposed surface of said target is not substantially flush with said top surface of said casement prior to said bonding.

48. The method of claim 37, wherein said target is not attached to said casement in said recess.

49. The method of claim 37, wherein said target is tightly fitted into said recess.

50. The method of claim 37, wherein said target is fitted into said recess such that a gap exists between said target and said recess.

51. The method of claim 50, wherein said gap is from about 1 to about 10 mm.

52. The method of claim 37, wherein prior to said bonding, a gap exists between said backing plate and said exposed surface of said target.

53. The method of claim 37, wherein prior to said bonding, said backing plate is substantially flush with said top surface of said casement, and wherein a gap exists between said backing plate and said exposed surface of said target.

54. The method of claim 37, wherein prior to said bonding, a protective layer is disposed on said top surface of said casement to prevent bonding of said casement to said backing plate.

55. The method of claim 54, wherein said protective layer is a cardboard layer.

56. The method of claim 37, wherein prior to said bonding, a protective layer is disposed in said recess to prevent bonding of said casement to said target in said recess.

57. The method of claim 37, wherein prior to said bonding, an interlayer is disposed on said top surface of said casement and said exposed surface of said target to facilitate said bonding.

58. The method of claim 37, wherein said removing said casement from said bonded target comprises cutting away at least a portion of said casement surrounding said bonded target.

59. The method of claim 58, wherein said removing further comprises machining away any remaining portion of the casement from said bonded target.

60. The method of claim 37, wherein said removing of said casement comprises cutting away portions of said casement surrounding said bonded target and providing a sufficient dimension around said bonded target to form a flange from said backing plate around said sputtering target.

61. The method of claim 37, wherein said removing of said casement from said bonded target involves removing portions of said casement in one or several steps.

62. The method of claim 37, wherein a bond strength between said target and said backing plate is from about 10,000 to about 75,000 p.s.i.

63. The method of claim 37, wherein a bond strength between said target and said backing plate is from about 29,000 to about 55,000 p.s.i.

64. The method of claim 37, wherein said target has an average grain size of less than about 100 microns.

65. The method of claim 37, wherein said backing plate has a hardness that is at least 10% greater in said backing plate after bonding compared to said backing plate prior to bonding to said target.

66. The method of claim 37, wherein said annealing is in an air furnace.

67. The method of claim 37, wherein said annealing occurs at a temperature of less than about 800° C.

68. A sputtering target formed by the method of claim 1.

69. A sputtering target formed by the method of claim 37.

70. A method of forming a bonded metal article, comprising:

bonding a backing plate to a metal article located in a recess in a top surface of a casement, wherein an exposed surface of said metal article is bonded to said backing plate to form a bonded metal article that is vacuum sealed within said recess;

annealing said bonded metal article to form an annealed bonded article; and removing at least a portion of said casement from said annealed bonded article to retrieve said bonded metal article.

71. The method of claim 70, wherein said annealing is in an air furnace.

72. The method of claim 70, wherein said annealing occurs at a temperature of less than about 800° C.

* * * * *